United States Patent
Yao et al.

(10) Patent No.: US 11,372,187 B2
(45) Date of Patent: Jun. 28, 2022

(54) NON-METALLIC LAYER STRANDED OPTICAL CABLE WITH REVERSAL POINT CAPABLE OF BEING POSITIONED AND METHOD FOR DETECTING THE REVERSAL POINT

(71) Applicant: NANJING WASIN FUJIKURA OPTICAL COMMUNICATION LTD., Nanjing (CN)

(72) Inventors: Qiang Yao, Nanjing (CN); Peng Xiang Yin, Nanjing (CN)

(73) Assignee: NANJING WASIN FUJIKURA OPTICAL COMMUNICATION LTD., Nanjing (CN)

( * ) Notice: Subject to any disclaimer, the term of this patent is extended or adjusted under 35 U.S.C. 154(b) by 343 days.

(21) Appl. No.: 16/624,305

(22) PCT Filed: Jan. 4, 2019

(86) PCT No.: PCT/CN2019/070330
§ 371 (c)(1),
(2) Date: Dec. 19, 2019

(87) PCT Pub. No.: WO2020/140246
PCT Pub. Date: Jul. 9, 2020

(65) Prior Publication Data
US 2021/0231894 A1 Jul. 29, 2021

(51) Int. Cl.
*G01R 33/02* (2006.01)
*G02B 6/44* (2006.01)
*G01V 3/08* (2006.01)
*G01R 33/07* (2006.01)
(Continued)

(52) U.S. Cl.
CPC ............. *G02B 6/447* (2013.01); *G01R 33/02* (2013.01); *G01R 33/04* (2013.01); *G01R 33/07* (2013.01);
(Continued)

(58) Field of Classification Search
CPC ...... G02B 6/447; G02B 6/4482; G02B 6/449; G01V 3/08; H01B 11/22; G01R 33/02;
(Continued)

(56) References Cited

U.S. PATENT DOCUMENTS

| 2002/0009282 A1* | 1/2002 | Grulick | G02B 6/449 385/147 |
| 2003/0002830 A1* | 1/2003 | Petryszak | D07B 7/022 385/109 |

(Continued)

FOREIGN PATENT DOCUMENTS

| CN | 201233759 Y | 5/2009 |
| CN | 103715589 A | 4/2014 |

(Continued)

OTHER PUBLICATIONS

CN 105700091 Machine Translation, Jun. 22, 2016 (Year: 2016).*

*Primary Examiner* — Raul J Rios Russo
(74) *Attorney, Agent, or Firm* — Bayramoglu Law Offices LLC

(57) ABSTRACT

A non-metallic layer stranded optical cable with a reversal point capable of being positioned and a detection method thereof, which solves the problems of determining a reversal point of a cable core and performing an operation of drawing out an optical fiber from the optical cable. The present invention relates to a non-metallic layer stranded optical cable, and the key points of the technical solution thereof includes a cable core and a metal film provided at each reversal point of the cable core, and an outer sheath is provided on the cable core.

8 Claims, 5 Drawing Sheets

(51) Int. Cl.
*G01R 33/09* (2006.01)
*G01R 33/04* (2006.01)
G01R 15/20 (2006.01)
G01R 33/028 (2006.01)
G01R 33/025 (2006.01)

(52) U.S. Cl.
CPC ........... *G01R 33/09* (2013.01); *G01R 33/093* (2013.01); *G01V 3/08* (2013.01); *G02B 6/4482* (2013.01); *G01R 15/207* (2013.01); *G01R 33/025* (2013.01); *G01R 33/028* (2013.01)

(58) Field of Classification Search
CPC ...... G01R 33/07; G01R 33/093; G01R 33/09; G01R 33/04; G01R 15/207; G01R 33/028; G01R 33/025
USPC ..................................... 324/51, 55, 228, 244
See application file for complete search history.

(56) References Cited

U.S. PATENT DOCUMENTS

| | | | | |
|---|---|---|---|---|
| 2010/0278494 | A1* | 11/2010 | Fortsch | G02B 6/449 |
| | | | | 29/428 |
| 2014/0112630 | A1* | 4/2014 | Hennink | G02B 6/4434 |
| | | | | 385/113 |
| 2017/0131496 | A1* | 5/2017 | Blazer | G02B 6/443 |

FOREIGN PATENT DOCUMENTS

| | | |
|---|---|---|
| CN | 105700091 A | 6/2016 |
| CN | 2056655442 U | 10/2016 |
| CN | 206546441 U | 10/2017 |
| CN | 107765313 A | 3/2018 |
| CN | 107870402 A | 4/2018 |
| JP | 2008058219 A | 3/2008 |
| JP | 2016057366 A | 4/2016 |

* cited by examiner

Step 1: Gradually release a reinforcing member and a loose tube by a reinforcing member pay-out stand and a loose tube pay-out stand. Enter an SZ stranding platform through a strand collecting frame, and then enter a bundling machine after outputting from the SZ stranding platform to form the cable core.

Step 2: Prepare a reversal point sample of the cable core with the specification to be manufactured and put an image of the reversal point sample into a high-definition image recognizing device as a reference standard for identifying the reversal point of the cable core by the device. Measure a length of the cable core from a point A to a point B, recorded as "L1", wherein the point A is an installation point of the high-definition image recognizing device and the point B is an installation point of a marking device of the metal film. After passing through the high-definition image recognizing device, make the cable core enter the marking device of the metal film through a tractor and make the cable core from the marking device of the metal film enter a length measuring device through a two-wheel tension regulating device.

Step 3: Collect the cable core from the length measuring device by a wire take-up machine.

FIG. 3

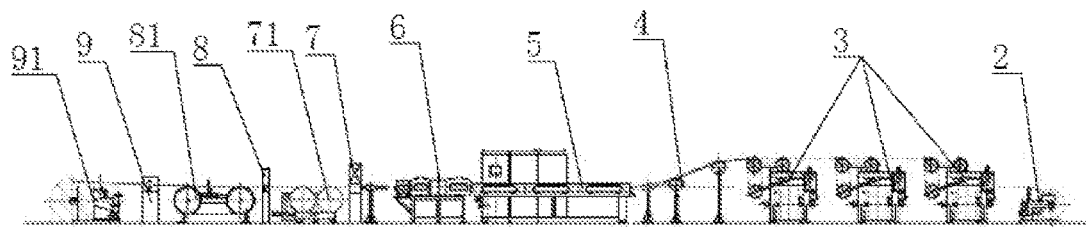

FIG. 4

NON-METALLIC LAYER STRANDED OPTICAL CABLE WITH REVERSAL POINT CAPABLE OF BEING POSITIONED AND METHOD FOR DETECTING THE REVERSAL POINT

CROSS REFERENCE TO THE RELATED APPLICATIONS

This application is the national phase entry of International Application No. PCT/CN2019/070330, filed on Jan. 4, 2019, the entire contents of which are incorporated herein by reference.

TECHNICAL FIELD

The present invention relates to a non-metallic layer stranded optical cable. More specifically, the present invention relates to a non-metallic layer stranded optical cable with a reversal point capable of being positioned and a method for detecting the reversal point.

BACKGROUND

The non-metallic layer stranded optical cable is a round stranded cable core formed by a plurality of optical fiber-containing loose tubes twisted around a central reinforcing member. The non-metallic reinforcing member is located at the center of the optical cable, and the optical fiber-containing loose tubes are arranged around the reinforcing member. SZ stranding technology is used in making the non-metallic layer stranded optical cable.

With the diversified development of optical communication transmission networks, drawing out a predetermined optical fiber from the middle section of the optical cable has become a routine requirement in the construction of optical cables. A SZ layer stranded optical cable can meet such requirements, but the reversal point of SZ stranding should be determined, which makes it difficult and inefficient for drawing out an optical fiber.

SUMMARY

The objective of the present invention is to provide a non-metallic layer stranded optical cable with a reversal point capable of being positioned, so that the reversal point of a cable core can be determined, which facilitates an operation of drawing out an optical fiber from the optical cable.

The above technical objective of the present invention is achieved by the following technical solutions: a non-metallic layer stranded optical cable with a reversal point capable of being positioned includes a cable core and a metal film provided at each reversal point of the cable core, and an outer sheath is provided outside the cable core.

By the above technical solution, the metal film is provided at each reversal point of the cable core, allowing each reversal point of the cable core to have the metal film, and the cable core is wrapped by the outer sheath. When the reversal point is needed to be determined, a metal detector is used to move along the cable core until the metal film is detected by the metal detector. That is, the reversal point of the cable core is found which facilitates the operation of drawing out the optical fiber from the optical cable.

Preferably, the metal film is formed by spraying a metallic paint on an outer wall of the cable core, or the metal film is attached to the outer wall of the cable core.

By the above technical solution, attaching and spraying are relatively simple construction methods thereby facilitating an operation of providing the metal film at the reversal point.

Another objective of the present invention is to provide a method for detecting the reversal point of the above non-metallic layer stranded optical cable with the reversal point capable of being positioned, including the following steps: when an operation of drawing out an optical fiber from the optical cable is performed, detecting a position of the metal film in the optical cable by a metal detector. After turning on the power of the metal detector, a metal detection is carried out. While holding a hand grip and detecting and scanning around the optical cable to be detected by a detecting surface and moving to a position of the metal film, the metal detector emits an alarm sound or vibration, and the position is determined to be the reversal point of the optical cable.

By the above technical solution, the position of the metal film is detected by the metal detector, which facilitates the operation. After the position of the metal film is detected, the outer sheath is cut to perform the operation of drawing out the optical fiber from the optical cable.

Another objective of the present invention is to provide a method for manufacturing a cable core of the above non-metallic layer stranded optical cable with the reversal point capable of being positioned, including the following steps.

Step 1: Gradually releasing a reinforcing member and a loose tube by a reinforcing member pay-out stand and a loose tube pay-out stand. Entering an SZ stranding platform through a strand collecting frame, and then entering a bundling machine after outputting from the SZ stranding platform to form the cable core.

Step 2: Preparing a reversal point sample of the cable core with the specification to be manufactured and putting an image of the reversal point sample into a high-definition image recognizing device as a reference standard for identifying the reversal point of the cable core by the device. Measuring a length of the cable core from a point A to a point B, recorded as "L1", wherein the point A is an installation point of the high-definition image recognizing device and the point B is an installation point of a marking device of the metal film. After passing through the high-definition image recognizing device, making the cable core enter the marking device of the metal film through a tractor and making the cable core from the marking device of the metal film enter a length measuring device through a two-wheel tension regulating device.

When a production line starts to run, and the high-definition image recognizing device recognizes the reversal point of SZ stranding, a signal is sent to the length measuring device. After the length measuring device receives a trigger signal from the high-definition image recognizing device, a length of the cable core is started to be measured. When a measured value is equal to the predetermined value L1, a signal is sent to the marking device of the metal film, and the device returns to zero and waits for a next trigger signal. When the marking device of the metal film receives a signal from the length measuring device, the metal film is immediately attached or a metal liquid is instantly sprayed on the cable core at the point B to mark the reversal point of the cable core and in this way, all reversal points of SZ stranding on the cable core are marked.

Step 3: Collecting the cable core from the length measuring device by a wire take-up machine.

By the above technical solution, after the processing on the cable core is completed, the cable core is identified by the high-definition image recognition device, facilitating to find out the position of the reversal point on the cable core. The marking device of the metal film facilitates the operation of providing the metal film onto the cable core. After the marking device of the metal film marks the reversal point of the cable core, the cable core is collected by the wire take-up machine, which realizes the mass-production of the mark at the reversal point.

Preferably, a gap between the high-definition image recognizing device and the marking device of the metal film is greater than 300 mm and less than a spacing between adjacent two reversal points.

By the above technical solution, the gap between the high-definition image recognizing device and the marking device of the metal film is less than the spacing between the adjacent two reversal points, which reduces the possibility of failing to mark the reversal point that is supposed to be marked.

Preferably, the marking device of the metal film is a labeling machine or a spraying robot.

By the above technical solution, the metal film is attached onto the cable core by the labeling machine, and the spraying robot sprays the metal liquid on the reversal point of the cable core when the cable core passes.

Preferably, the high-definition image recognizing device includes an image inputting module configured for acquiring information of the reversal point sample of the cable core, an image information acquiring unit configured for acquiring information of the reversal point of the cable core, and a comparing module configured for comparing the information of the reversal point sample of the cable core with the acquired information of the reversal point of the cable core, and if the acquired information is consistent with the information of the reversal point sample, determining the reversal point of the cable core, and sending a signal to the length measuring device.

By the above technical solution, the high-definition image recognizing device collects the reversal point sample of the cable core as a sample through the image inputting module. The image information acquiring unit collects the reversal point of the cable core. The comparing module identifies the reversal point of the cable core, and sends information to the length measuring device. At this time, when detecting that the cable core transmits the length L1, the length measuring device sends a signal to the marking device of the metal film, which facilitates the operation at the reversal point of the cable core by the marking device of the metal film.

Preferably, the spraying robot includes a spray gun and a connecting rod extending downward provided on the spray gun. A storage box opposite to a muzzle of the spray gun is provided at one end of the connecting rod away from the spray gun.

By the above technical solution, the setting of the storage box makes allows the surrounding metal liquid to be collected when the reversal point of the cable core is sprayed by the spray gun, thereby improving the cleanliness of the working environment for the spraying robot.

Preferably, a moving member is respectively provided at lower ends of the high-definition image recognizing device and the marking device of the metal film to make the high-definition image recognizing device and the marking device of the metal film move.

By the above technical solution, the setting of the moving member facilitates an adjustment of a distance between the high-definition image recognizing device and the marking device of the metal film, thereby facilitating the processing of different types of reversal points of the cable core.

Preferably, the moving member includes a moving plate provided at the lower end of the high-definition image recognizing device or the marking device of the metal film. Rollers are provided at a lower end of the moving plate. A plurality of vertical supporting columns and the moving plate are in a threaded connection, and a length of each of the supporting columns is greater than a height of each of the rollers. A marking plate with a scale is provided on one of the moving plates. The marking plate extends toward the other moving plate. An indicating plate is provided on the other moving plate through which the marking plate passes.

By the above technical solution, when the moving plate needs to be moved, the supporting columns are rotated away from the ground, so that the rollers are in contact with the ground, thereby facilitating to move the high-definition image recognizing device or the marking device of the metal film. The settings of the marking plate and the indicating plate enable the high-definition image recognizing device or the marking device of the metal film to move in a straight line while moving, and the presence of the marking plate can realize a precise adjustment of the distance between the high-definition image recognizing device and the marking device of the metal film, so that the high definition image recognizing device and the marking device of the metal film are adjusted according to the distance between adjacent reversal points on the cable core.

In summary, the present invention has the advantages of the metal film is provided at each reversal point of the cable core, allowing each reversal point of the cable core to have the metal film, and the cable core is wrapped by the outer sheath. When the reversal point is needed to be determined, a metal detector is used to move along the cable core until the metal film is detected by the metal detector. That is, the reversal point of the cable core is found which facilitates the operation of drawing the optical fiber from the optical cable.

BRIEF DESCRIPTION OF THE DRAWINGS

FIG. 3 is a flow chart of a manufacturing method according to embodiment 3;

FIG. 4 is a diagram of devices for manufacturing a cable core according to embodiment 3;

In the figures:1—cable core; 11—metal film; 12—outer sheath; 2—reinforcing member pay-out stand; 3—loose tube pay-out stand; 4—strand collecting frame; 5—SZ stranding platform; 7—high-definition image recognizing device; 71—tractor; 8—marking device of a metal film; 81—two-wheel tension regulating device; 82—spray gun; 83—connecting rod; 84—storage box; 85—moving plate; 86—roller; 87—supporting column; 88—marking plate; 89—indicating plate; 9—length measuring device; and 91—wire take-up machine.

DETAILED DESCRIPTION OF THE EMBODIMENTS

The present invention is further described in detail below with reference to the accompanying drawings.

Embodiment 1

Figure 1:
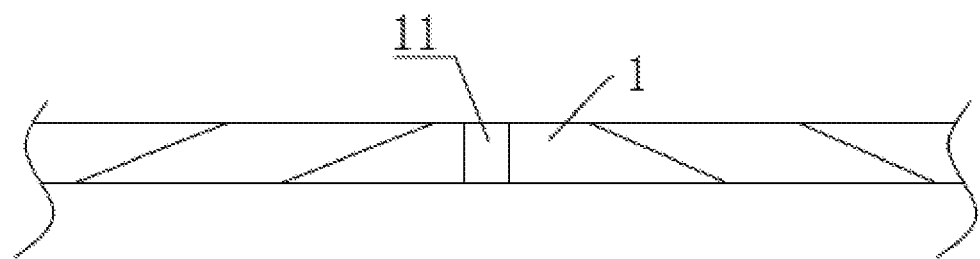
FIG. 1 is a structural schematic diagram according to embodiment 1.
Figure 2:
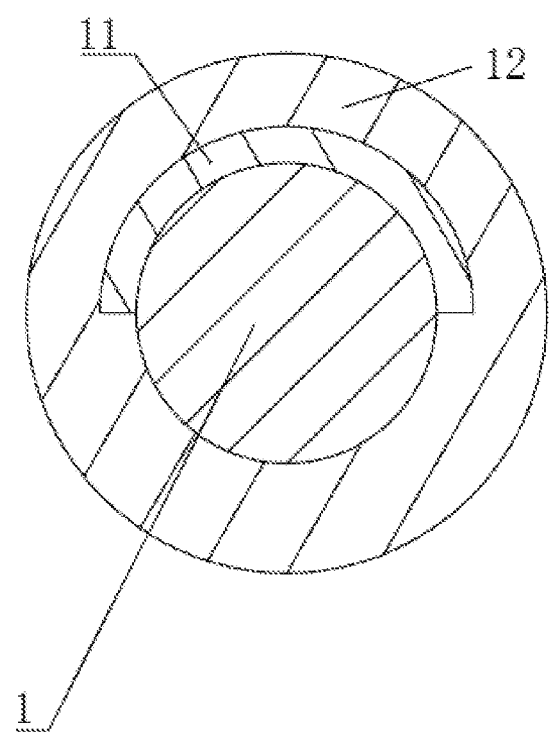
FIG. 2 is a structural schematic diagram of embodiment 1 showing an outer sheath.

A non-metallic layer stranded optical cable with a reversal point capable of being positioned is provided, as shown in FIG. 1 and FIG. 2, whose cable core 1 is manufactured by SZ stranding technology. The non-metallic layer stranded optical cable with the reversal point capable of being positioned includes the cable core 1 and the metal film 11 provided at each reversal point of the cable core 1. The metal film 11 is provided at one side of the cable core 1, or may be wrapped on an outer side of the cable core 1, but is not limited thereto. The outer sheath 12 is provided outside the cable core 1.

As shown in FIG. 1 and FIG. 2, when the reversal point is needed to be found, a metal detector is used to move along the cable core 1 until the metal film 11 is detected by the metal detector. That is, the reversal point of the cable core 1 is found, which facilitates an operation of drawing an optical fiber from the optical cable, eases the construction and effectively improves the construction efficiency.

As shown in FIG. 1 and FIG. 2, the metal film 11 is formed by spraying a metallic paint on an outer wall of the cable core 1. Alternatively, the metal film 11 is attached to the outer wall of the cable core 1, and a bonding layer is provided on one side of the metal film 11 facing the cable core 1. The metal film 11 can be quickly and easily applied to the reversal point of the cable core 1 by the above two methods. However, the construction method of the metal film 11 in the present invention is not limited to the above two methods.

Embodiment 2

A method for detecting the reversal point of the non-metallic layer stranded optical cable with the reversal point capable of being positioned in embodiment 1 includes the following steps. When an operation of drawing out the optical fiber from the optical cable is performed, a position of the metal film 11 in the optical cable is detected by the metal detector. After turning on the power of the metal detector, a metal detection can be performed. While holding a hand grip and detecting and scanning around the optical cable to be detected by a detecting surface and reaching the position of the metal film 11, the metal detector emits an alarm sound or vibration, and this position is the reversal point of the optical cable. After the position of the metal film 11 is detected, the outer sheath 12 is cut to perform the operation of drawing out the optical fiber from the optical cable, which facilitates the operation.

Embodiment 3

A method for manufacturing the non-metallic layer stranded optical cable with the reversal point capable of being positioned in embodiment 1 is provided, as shown in FIG. 3 and FIG. 4, and includes the below steps.

Step 1: The reinforcing member and the loose tube are gradually released by the reinforcing member pay-out stand 2 and the loose tube pay-out stand 3. Enter the SZ stranding platform 5 through the strand collecting frame 4, and then enter the bundling machine 6 after outputting from the SZ stranding platform 5 to form the cable core 1.

Step 2: A reversal point sample of the cable core 1 with the specification to be manufactured is prepared, and an image of the reversal point sample is input into the high-definition image recognizing device 7 as a reference standard for identifying the reversal point of the cable core 1 by the device. An installation point of the high-definition image recognizing device 7 is referred to as "point A". An installation point of the marking device of the metal film 11 is referred to as "point B" and a length of the cable core 1 from the point A to the point B is measured and recorded as "L1". The cable core 1 passes through the high-definition image recognizing device 7 and enters the marking device of the metal film 11 through the tractor 71. The cable core 1 from the marking device of the metal film 11 enters the length measuring device 9 through the two-wheel tension regulating device 81.

When the production line starts to run and the high-definition image recognizing device 7 recognizes the reversal point of SZ stranding, a signal is sent to the length measuring device 9. After receiving a trigger signal from the high-definition image recognizing device 7, the length measuring device 9 starts to measure a length of the cable core 1. When a measured value is equal to the predetermined value L1, a signal is sent to the marking device of the metal film 11, and the device returns to zero, waiting for a next trigger signal. When the marking device of the metal film 11 receives a signal from the length measuring device 9, a metal film is immediately attached or a metal liquid is instantly sprayed onto the cable core 1 at the point B to mark the reversal point of the cable core 1. In this way, all reversal points of SZ stranding in the cable core 1 are marked, which realizes the mass-production of the mark at the reversal point.

Step 3: The cable core 1 from the length measuring device 9 is then collected by the wire take-up machine 91.

As shown in FIG. 4, a gap between the high-definition image recognizing device 7 and the marking device of the metal film 11 is greater than 300 mm, and is less than a spacing between two adjacent reversal points, which reduces the possibility of failing to mark the reversal point that is supposed to be marked.

Figure 5:
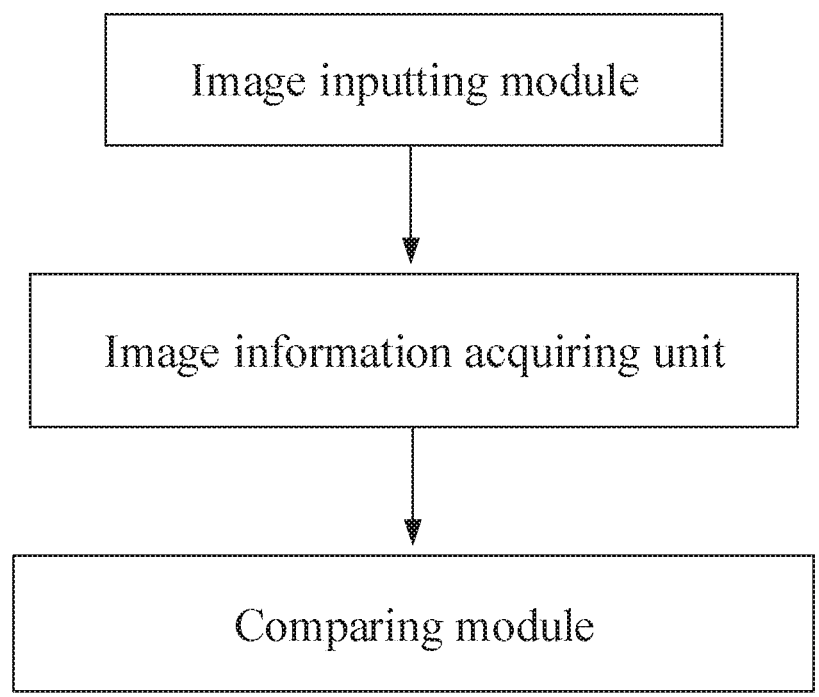
FIG. 5 is a structural schematic diagram of a high-definition image recognizing device according to embodiment 3.

As shown in FIG. 4 and FIG. 5, the marking device of the metal film 11 is a labeling machine or a spraying robot. The model of the spraying robot may be an RDPT01 spraying robot. The metal film 11 is attached onto the cable core 1 by the labeling machine. The spraying robot sprays the metal liquid on the reversal point of the cable core 1 when the cable core 1 passes.

As shown in FIG. 5, the high-definition image recognizing device 7 includes an image inputting module configured for acquiring information of a reversal point sample of the cable core 1, an image information acquiring unit configured for acquiring information of a reversal point of the cable core 1, and a comparing module configured for comparing the information of the reversal point sample of the cable core 1 with the acquired information of the reversal point of the cable core 1, and if the acquired information is consistent with the information of the reversal point sample, the reversal point of the cable core 1 is determined, and a signal is sent to the length measuring device 9. The high-definition image recognizing device 7 collects the reversal point sample of the cable core 1 as a sample through the image inputting module. The image information acquiring unit collects the reversal point of the cable core 1. The comparing module identifies the reversal point of the cable core 1, and sends the information to the length measuring device 9. At this time, when detecting that the cable core 1 transmits the length L 1, the length measuring device 9 sends a signal to the marking device of the metal film 11, which facilitates the construction at the reversal point of the cable core 1 by the marking device of the metal film 11.

Figure 6:
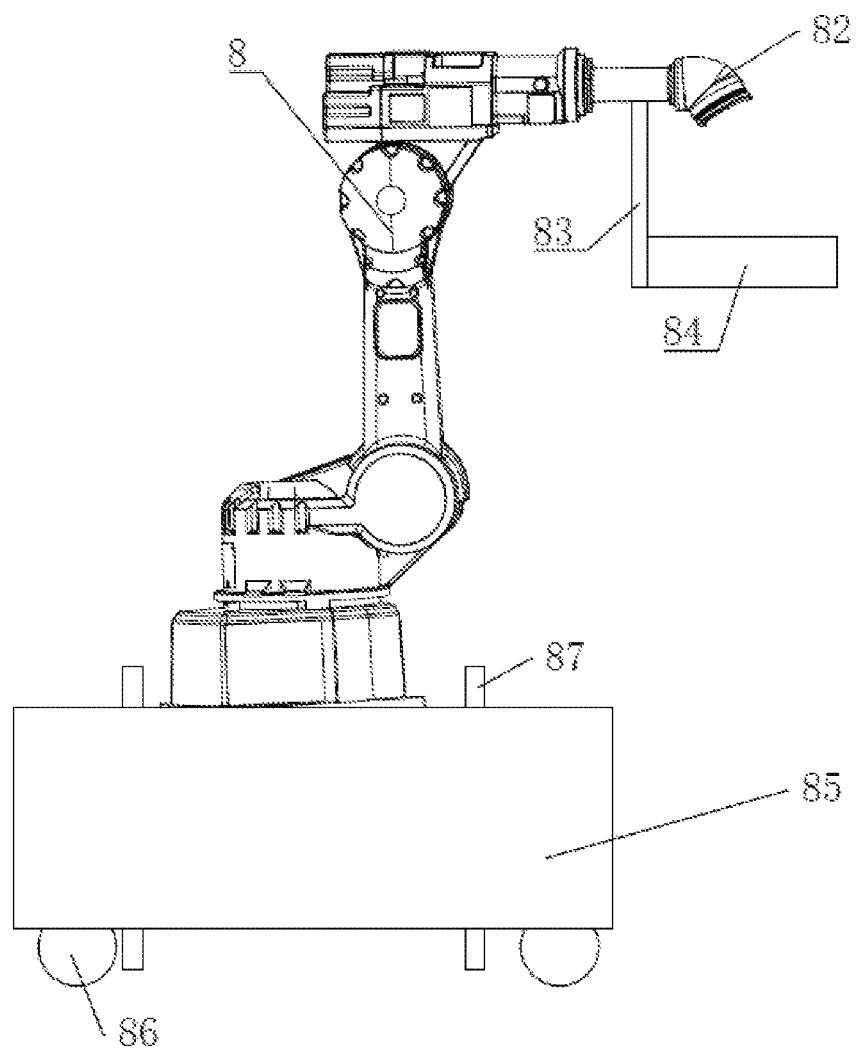
FIG. 6 is a structural schematic diagram of a moving member according to embodiment 3.

As shown in FIG. 6, the spraying robot includes the spray gun 82 and the connecting rod 83 extending downward provided on the spray gun 82. The storage box 84 opposite to a muzzle of the spray gun 82 is provided at one end of the connecting rod 83 away from the spray gun 82. The setting of the storage box 84 allows the surrounding metal liquid to be collected when the reversal point of the cable core 1 is sprayed by the spray gun 82, thereby improving the cleanliness of the working environment for the spraying robot.

Figure 7:
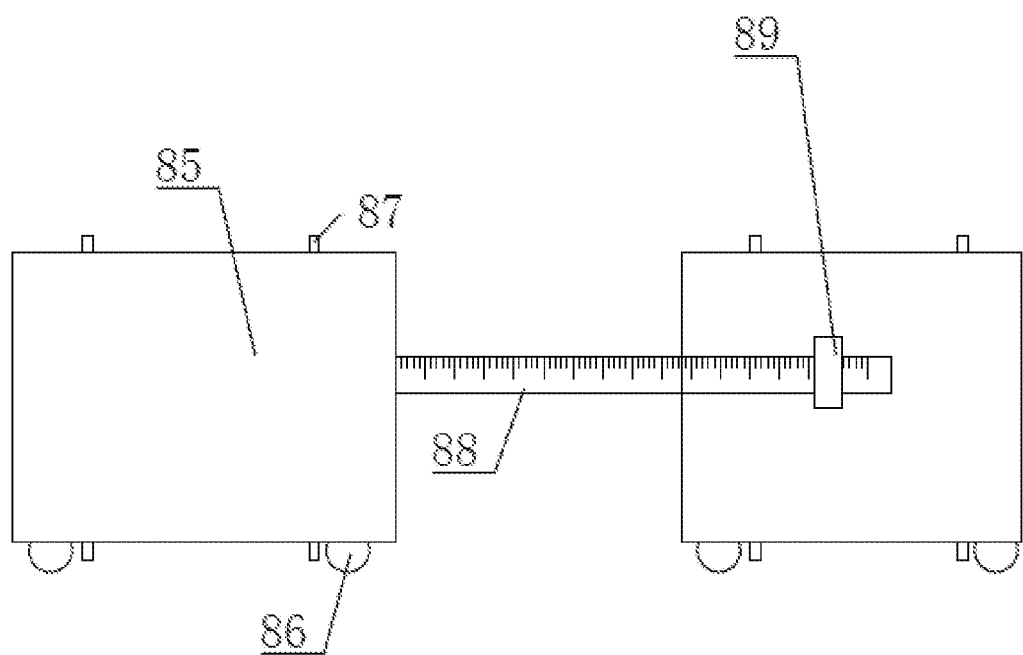
FIG. 7 is a structural schematic diagram of a marking plate according to embodiment 3.

As shown in FIG. 6 and FIG. 7, when processing different types of the reversal points of the cable core 1, a moving member is respectively provided at lower ends of the high-definition image recognizing device 7 and the marking device of the metal film 11 to make the high-definition image recognizing device 7 and the marking device of the metal film 11 move. The setting of the moving member facilitates adjusting the distance between the high-definition image recognizing device 7 and the marking device of the metal film 11, thereby facilitating the processing of the different types of the reversal points of the cable core 1.

As shown in FIG. 6 and FIG. 7, the moving member includes the moving plate 85 provided at the lower end of the high-definition image recognizing device 7 or the marking device of the metal film 11. Rollers 86 are provided at a lower end of the moving plate 85. The number of the rollers 86 can be four, and the rollers 86 are distributed at four corners of the moving plate 85. A plurality of vertical supporting columns 87 and the moving plate 85 are in a threaded connection, and the length of each of the supporting columns 87 is greater than the height of each of the rollers 86. When the moving plate 85 needs to be moved, the supporting columns 87 are rotated away from the ground, so that the rollers 86 are in contact with the ground, thereby facilitating to move the high-definition image recognizing device 7 or the marking device of the metal film 11. When the position of the high definition image recognizing device 7 or the marking device of the metal film 11 is needed to be fixed, the supporting columns 87 are rotated downward until the supporting columns 87 are in contact with the ground and the rollers 86 are lifted off the ground.

As shown in FIG. 6 and FIG. 7, the marking plate 88 with the scale is provided on one of the moving plates 85. The marking plate 88 extends toward the other moving plate 85. The indicating plate 89 is provided on the other moving plate 85 through which the marking plate 88 passes.

As shown in FIG. 6 and FIG. 7, the settings of the marking plate 88 and the indicating plate 89 enable the high-definition image recognizing device 7 or the marking device of the metal film 11 to move in a straight line while moving, and the presence of the marking plate 88 can realize a precise adjustment of the distance between the high-definition image recognizing device 7 and the marking device of the metal film 11, so that the high definition image recognizing device 7 and the marking device of the metal film 11 are adjusted according to the distance between adjacent reversal points on the cable core 1.

Only the preferred embodiments of the present invention are described above. The protective scope of the present invention is not limited to the above embodiments, and all the technical solutions under the inventive concept of the present invention fall within the protective scope of the present invention. It should be noted that a number of improvements and modifications can be made by those skilled in the art without departing from the principles of the present invention, and such improvements and modifications are also considered to be within the scope of the present invention.

What is claimed is:

1. A method for manufacturing a cable core of a non-metallic layer stranded optical cable with a reversal point capable of being positioned, the cable further includes a metal film at each reversal point of the cable core and an outer sheath outside of the cable core, the method comprises:
   step 1, gradually releasing a reinforcing member and a loose tube by a reinforcing member pay-out stand and a loose tube pay-out stand, entering an SZ stranding platform through a strand collecting frame, and then entering a bundling machine after outputting from the SZ stranding platform to form the cable core;
   step 2, preparing a reversal point sample of the cable core with a specification to be manufactured, and inputting an image of the reversal point sample into a high-definition image recognizing device as a reference standard for identifying the reversal point of the cable core by the high-definition image recognizing device; measuring a length of the cable core from a first point to second point, recorded as "L1", wherein the first point is an installation point of the high-definition image recognizing device, and the second point is an installation point of a marking device of the metal film; after passing through the high-definition image recognizing device, making the cable core enter the marking device of the metal film through a tractor; and making the cable core from the marking device of the metal film enter a length measuring device through a two-wheel tension regulating device;
   wherein when a production line starts to run, and the high-definition image recognizing device recognizes the reversal point of SZ stranding, a signal is sent to the length measuring device; after the length measuring device receives a trigger signal from the high-definition image recognizing device, a length of the cable core is started to be measured; when a measured value is equal to the predetermined value L1, a signal is sent to the marking device of the metal film, the marking device returns to zero and waits for a next trigger signal; when the marking device of the metal film receives a signal from the length measuring device, a metal film is immediately attached or a metal liquid is instantly sprayed on the cable core at the second point to mark the reversal point of the cable core; and all reversal points of SZ stranding in the cable core are marked; and
   step 3, collecting the cable core from the length measuring device by a wire take-up machine.

2. The method of claim 1, wherein, a gap between the high-definition image recognizing device and the marking device of the metal film is greater than 300 mm and less than a spacing between adjacent two reversal points.

3. The method of claim 1, wherein, the marking device of the metal film is a labeling machine or a spraying robot.

4. The method of claim 1, wherein, the high-definition image recognizing device comprises an image inputting module configured for acquiring information of the reversal point sample of the cable core, an image information acquiring unit configured for acquiring information of the reversal point of the cable core, and a comparing module configured for comparing the information of the reversal point sample of the cable core with the acquired information of the reversal point of the cable core, and if the acquired information is consistent with the information of the reversal point sample, determining as the reversal point of the cable core and sending a signal to the length measuring device.

5. The method of claim 3, wherein, the spraying robot comprises a spray gun and a connecting rod extending downward provided on the spray gun, and a storage box opposite to a muzzle of the spray gun is provided at one end of the connecting rod away from the spray gun.

6. The method of claim 1, wherein, a moving member is respectively provided at lower ends of the high-definition image recognizing device and the marking device of the metal film to make the high-definition image recognizing device and the marking device of the metal film move.

7. The method of claim 6, wherein, the moving member comprises a moving plate provided at the lower end of the high-definition image recognizing device or the marking device of the metal film; rollers are provided at a lower end of the moving plate; a plurality of vertical supporting columns and the moving plate are in threaded connection, and a length of each of the supporting columns is greater than a height of each of the rollers; a marking plate with a scale is provided on the moving plate; the marking plate extends toward another moving plate; and an indicating plate is provided on the other moving plate through which the marking plate passes.

8. The method of claim 1, wherein, the metal film is formed by spraying a metallic paint on an outer wall of the cable core, or the metal film is attached to the outer wall of the cable core.

* * * * *